(12) United States Patent
Chen et al.

(10) Patent No.: US 7,692,960 B2
(45) Date of Patent: Apr. 6, 2010

(54) SCHEME OF SEMICONDUCTOR MEMORY AND METHOD FOR OPERATING SAME

(75) Inventors: Chang-Ting Chen, Hsinchu (TW); Chun-Jen Huang, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/641,992

(22) Filed: Dec. 20, 2006

(65) Prior Publication Data

US 2008/0151620 A1 Jun. 26, 2008

(51) Int. Cl.
*G11C 7/00* (2006.01)

(52) U.S. Cl. .................................. 365/180; 365/185.16

(58) Field of Classification Search .................. 365/180, 365/185.16
See application file for complete search history.

(56) References Cited

U.S. PATENT DOCUMENTS

| | | | | |
|---|---|---|---|---|
| 5,521,866 A | * | 5/1996 | Akaogi | 365/185.29 |
| 5,563,842 A | * | 10/1996 | Challa | 365/230.06 |
| 5,815,449 A | * | 9/1998 | Taura | 365/200 |
| 6,088,265 A | | 7/2000 | Ohta | |
| 6,532,176 B1 | * | 3/2003 | Kushnarenko | 365/185.25 |
| 6,567,335 B1 | * | 5/2003 | Norman et al. | 365/230.06 |
| 6,570,810 B2 | | 5/2003 | Wong | |
| 6,801,463 B2 | * | 10/2004 | Khellah et al. | 365/203 |
| 2002/0075720 A1 | * | 6/2002 | Akita | 365/149 |
| 2006/0013041 A1 | * | 1/2006 | Lin | 365/185.05 |
| 2006/0114737 A1 | * | 6/2006 | Terasawa et al. | 365/227 |
| 2006/0120138 A1 | * | 6/2006 | Liaw et al. | 365/149 |
| 2006/0126389 A1 | * | 6/2006 | Sarig | 365/185.21 |
| 2006/0273404 A1 | * | 12/2006 | Scheuerlein | 257/390 |
| 2007/0053225 A1 | * | 3/2007 | Lin et al. | 365/185.29 |

* cited by examiner

*Primary Examiner*—Michael T Tran
(74) *Attorney, Agent, or Firm*—Rabin & Berdo, P.C.

(57) ABSTRACT

A method for improving an over erasing effect of a charge-trapping memory cell. The charge-trapping memory cell has a transistor, which has a first terminal coupled to a first bit line and a second terminal coupled to a second bit line. First, the method erases the charge-trapping memory cell. Then, after the charge-trapping memory cell is completely erased, the first bit line is electrically connected to the second bit line to make a voltage level of the first bit line equal a voltage level of the second bit line such that the voltage level of the first terminal of the transistor equals the voltage level of the second terminal of the transistor.

10 Claims, 4 Drawing Sheets

SCHEME OF SEMICONDUCTOR MEMORY AND METHOD FOR OPERATING SAME

BACKGROUND OF THE INVENTION

1. Field of the Invention

The invention relates in general to a method for improving an over erasing effect of a charge-trapping memory cell and a charge-trapping memory structure thereof, and more particularly to a method for improving an over erasing effect of a charge-trapping memory cell and a charge-trapping memory structure thereof capable of saving a layout area and the time of programming the over-erased cells.

2. Description of the Related Art

Electrically programmable and erasable non-volatile memories are used in various applications, and a charge-trapping memory or Nitride Read-Only Memory is also one of the non-volatile memories based on a charge trapping dielectric layer. Data is stored using the charge trapping dielectric layer such as a silicon nitride layer to trap charges. When negative charges are trapped, a threshold voltage of the memory cell increases. When the negative charges are removed from the charge trapping dielectric layer, the threshold voltage of the memory cell is decreased. This operation is referred to as the so-called erasing.

If the bias arrangement causes too many negative charges to be removed from the charge trapping dielectric layer, the threshold voltage of the memory cell becomes too low, and the memory cell is over erased, which causes the memory cell to generate a leakage current and thus influences the normal operation of the memory cell array.

FIG. 1 is a schematic illustration showing a conventional charge-trapping memory structure 100. Referring to FIG. 1, the charge-trapping memory structure 100 includes M word lines WL1 to WLM and a plurality of charge-trapping memory cell blocks. In FIG. 1, only one first charge-trapping memory cell block 110 and one second charge-trapping memory cell block 120 are illustrated without limitation. Each charge-trapping memory cell block includes a plurality of memory cells. Each memory cell includes a transistor, which is a floating gate field effect transistor.

In addition, each charge-trapping memory cell block further includes a plurality of bit lines BD each formed by buried diffusion. Each bit line BD is coupled to a switch SW, for example a bank select transistor. In addition, for example, multiple Y multiplexers correspond to one charge-trapping memory cell block. Each Y multiplexer is coupled to a sense amplifier 130 and corresponds to two bit lines BD. In the first charge-trapping memory cell block 110, a boundary abutting on the second charge-trapping memory cell block 120 has M boundary charge-trapping memory cells having transistors defined as boundary transistors BT1 to BTM. The bit line located in the first charge-trapping memory cell block 110 and coupled to the boundary transistors BT1 to BTM is defined as a first bit line BD1, and the bit line located in the second charge-trapping memory cell block 120 and coupled to the boundary transistors BT1 to BTM is defined as a second bit line BD2.

Typically, the erasing operations of the charge-trapping memory structure 100 are sequentially executed by each of the charge-trapping memory cell blocks. For example, the first charge-trapping memory cell block 110 cannot be erased until the second charge-trapping memory cell block 120 is erased. However, in the above-mentioned procedure, the boundary transistors BT1 to BTM perform two times of erasing operations. That is, the negative charges of each of the M boundary charge-trapping memory cells are removed twice. Consequently, it is possible to cause the too low threshold voltages of the M boundary charge-trapping memory cells and the over erased phenomenon is thus caused so that the charge-trapping memory structure 100 cannot be correctly read.

In addition, if the first charge-trapping memory cell block 110 is a repaired array block, the boundary transistors BT1 to BTM perform the erasing operations once after the second charge-trapping memory cell block is completely erased. However, because the M boundary charge-trapping memory cells are located in the repaired array block, they cannot receive program pulses after the erasing operations. Consequently, the M boundary charge-trapping memory cells will be over erased after the erasing operations such that the charge-trapping memory structure 100 cannot be correctly read. In addition, the over erased phenomenon enables the boundary transistors BT1 to BTM to generate leakage currents, which cause the sense amplifier 130 to see error currents through the Y multiplexers such that the verification of the charge-trapping memory structure 100 has errors. Furthermore, the effect caused by the over erased phenomenon mentioned above is more serious in a charge-trapping memory structure with high cycles.

FIG. 2 is a schematic illustration showing a conventional charge-trapping memory structure 200 with an isolating region. In the charge-trapping memory structure 200, an isolating region 240 is additionally disposed between a first charge-trapping memory cell block 210 and a second charge-trapping memory cell block 220. Consequently, the erasing operations of the first charge-trapping memory cell block 210 and the second charge-trapping memory cell block 220 cannot influence the charge-trapping memory cells on the boundary therebetween, so the boundary charge-trapping memory cells cannot be over erased. However, when the size of the charge-trapping memory structure 200 is large, the additional isolating region 240 wastes the layout area. In addition, it is usually necessary to add a STI (Shallow Trench Isolation) process to the manufacturing process to form the isolating region 240, thereby increasing the cost.

FIG. 3 is a schematic illustration showing a conventional charge-trapping memory structure 300 using a dummy cell. In the charge-trapping memory structure 300, an additional column of dummy cells 340 is disposed between a first charge-trapping memory cell block 310 and a second charge-trapping memory cell block 320. Consequently, the erasing operations of the first charge-trapping memory cell block 310 and the second charge-trapping memory cell block 320 cannot influence the charge-trapping memory cells on the boundary therebetween, and the boundary charge-trapping memory cells cannot be over erased. However, in the program pulse after erasing of the charge-trapping memory structure 300, the dummy cells have to be considered. So, extra pulses have to be increased, thereby deteriorating the behavior of the charge-trapping memory structure 300 and lengthening the program time.

SUMMARY OF THE INVENTION

It is therefore an object of the invention to provide a method for improving an over erasing effect of a charge-trapping memory cell and a charge-trapping memory structure thereof, in which an equalization transistor is utilized to equalize voltage levels of bit lines coupled to boundary transistors after the charge-trapping memory cell is completely erased such that voltage levels of first and second terminals of the boundary transistor equal each other without the leakage current of the charge-trapping memory cell.

The invention achieves the above-identified object by providing a method for improving an over erasing effect of a charge-trapping memory cell. The charge-trapping memory cell has a transistor having a first terminal coupled to a first bit line and a second terminal coupled to a second bit line. This method includes the following steps. First, the charge-trapping memory cell is erased. Then, the first bit line is electrically connected to the second bit line when the charge-trapping memory cell is completely erased to make a voltage level of the first bit line equal a voltage level of the second bit line such that a voltage level of the first terminal of the transistor equals a voltage level of the second terminal of the transistor. The transistor doesn't exert an influence on the function of the charge-trapping memory cell as the charge-trapping memory cell has been repaired.

The invention achieves the above-identified object by providing a method for improving an over erasing effect of a charge-trapping memory cell. The charge-trapping memory cell has a transistor having a first terminal coupled to a first bit line and a second terminal coupled to a second bit line. The method includes the following steps. First, the charge-trapping memory cell is erased. Then, an equalization transistor is employed to electrically connecting the first bit line to the second bit line when the charge-trapping memory cell is completely erased to prevent a leakage current of the charge-trapping memory cell.

The invention also achieves the above-identified object by providing a charge-trapping memory structure including M word lines, a first charge-trapping memory cell block, a second charge-trapping memory cell block and an equalization transistor, wherein M is a positive integer. The first charge-trapping memory cell block has M boundary charge-trapping memory cells and a first bit line. The boundary charge-trapping memory cells respectively have boundary transistors, which respectively have control terminals coupled to the corresponding word lines and first terminals coupled to the first bit line. The second charge-trapping memory cell block has a second bit line abutting on the first bit line. The second terminals of the boundary transistors are coupled to the second bit line. The equalization transistor has a first terminal coupled to the first bit line, a second terminal coupled to the second bit line, and a control terminal controlled by an equalization enable signal.

Other objects, features, and advantages of the invention will become apparent from the following detailed description of the preferred but non-limiting embodiment. The following description is made with reference to the accompanying drawing.

DETAILED DESCRIPTION OF THE INVENTION

The invention provides a method for improving an over erasing effect of a charge-trapping memory cell and a charge-trapping memory structure thereof, wherein an equalization transistor is utilized to equalize the voltage levels of the bit lines coupled to the boundary transistors after the erasing operations to equalize the voltage levels of the first terminal and the second terminal of the boundary transistors to improve the over erasing effect and to prevent a leakage current of the charge-trapping memory cell.

Figure 1:
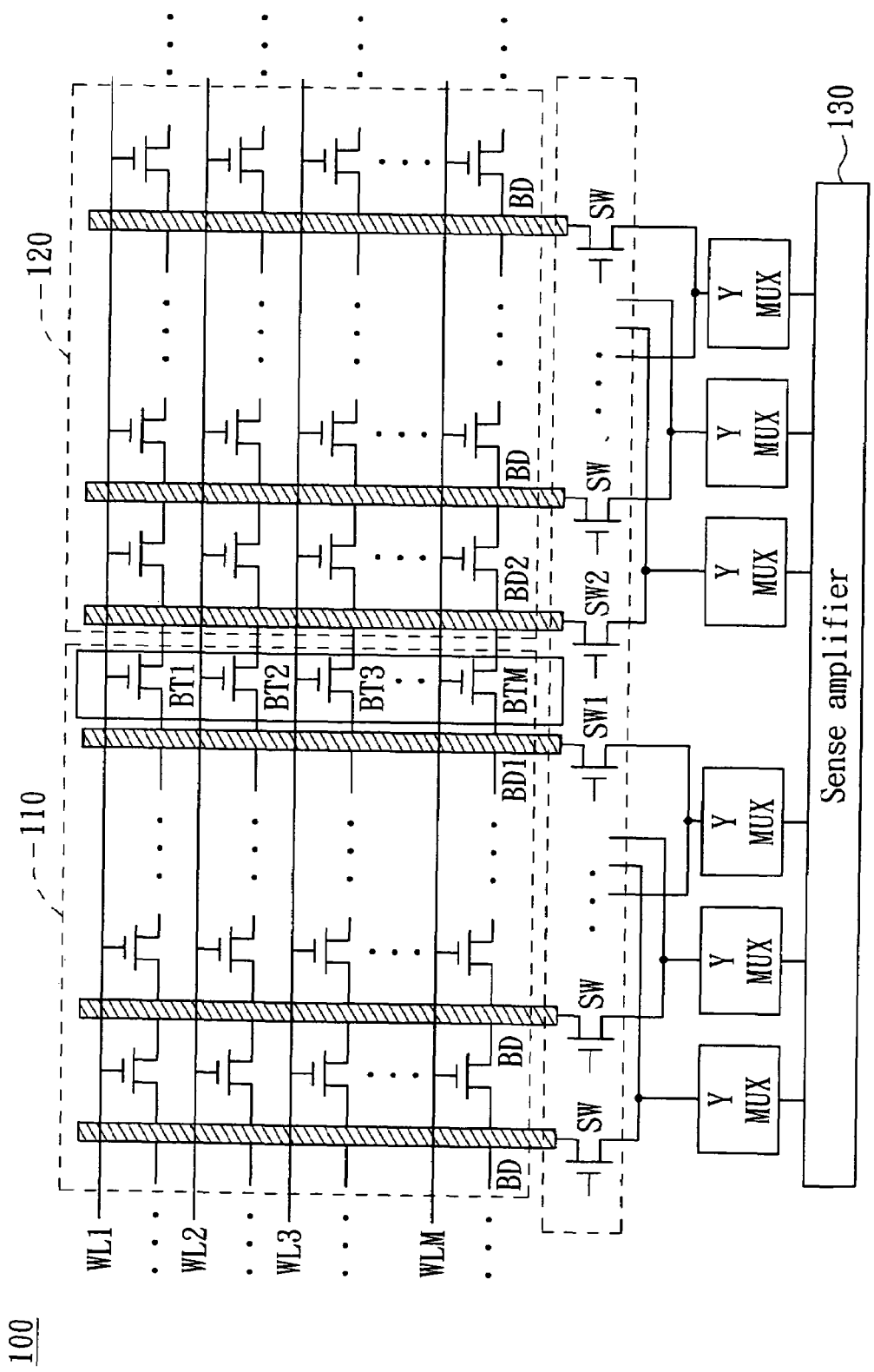
FIG. 1 (Prior Art) is a schematic illustration showing a conventional charge-trapping memory structure.
Figure 2:
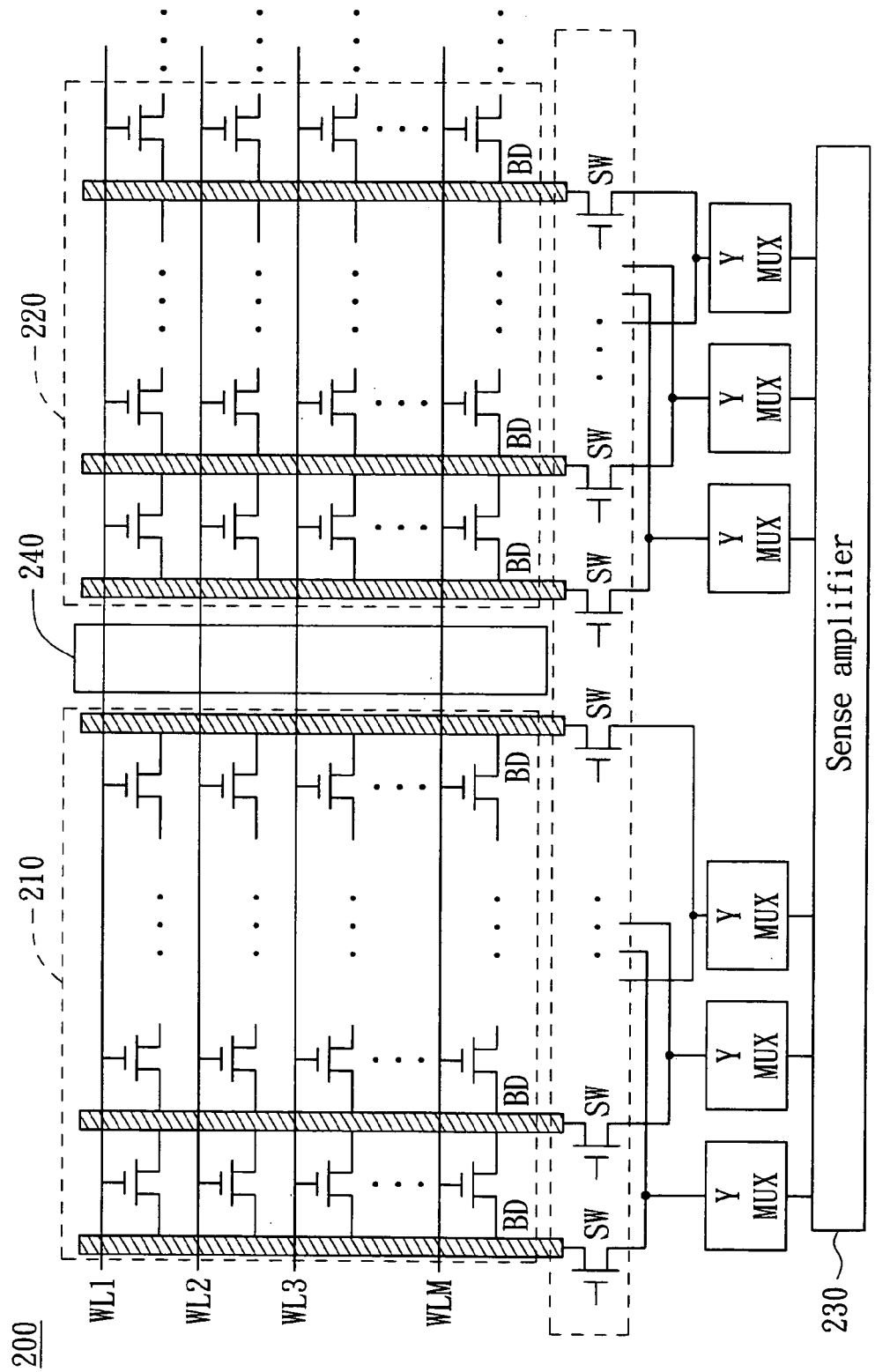
FIG. 2 (Prior Art) is a schematic illustration showing a conventional charge-trapping memory structure with an isolating region.
Figure 3:
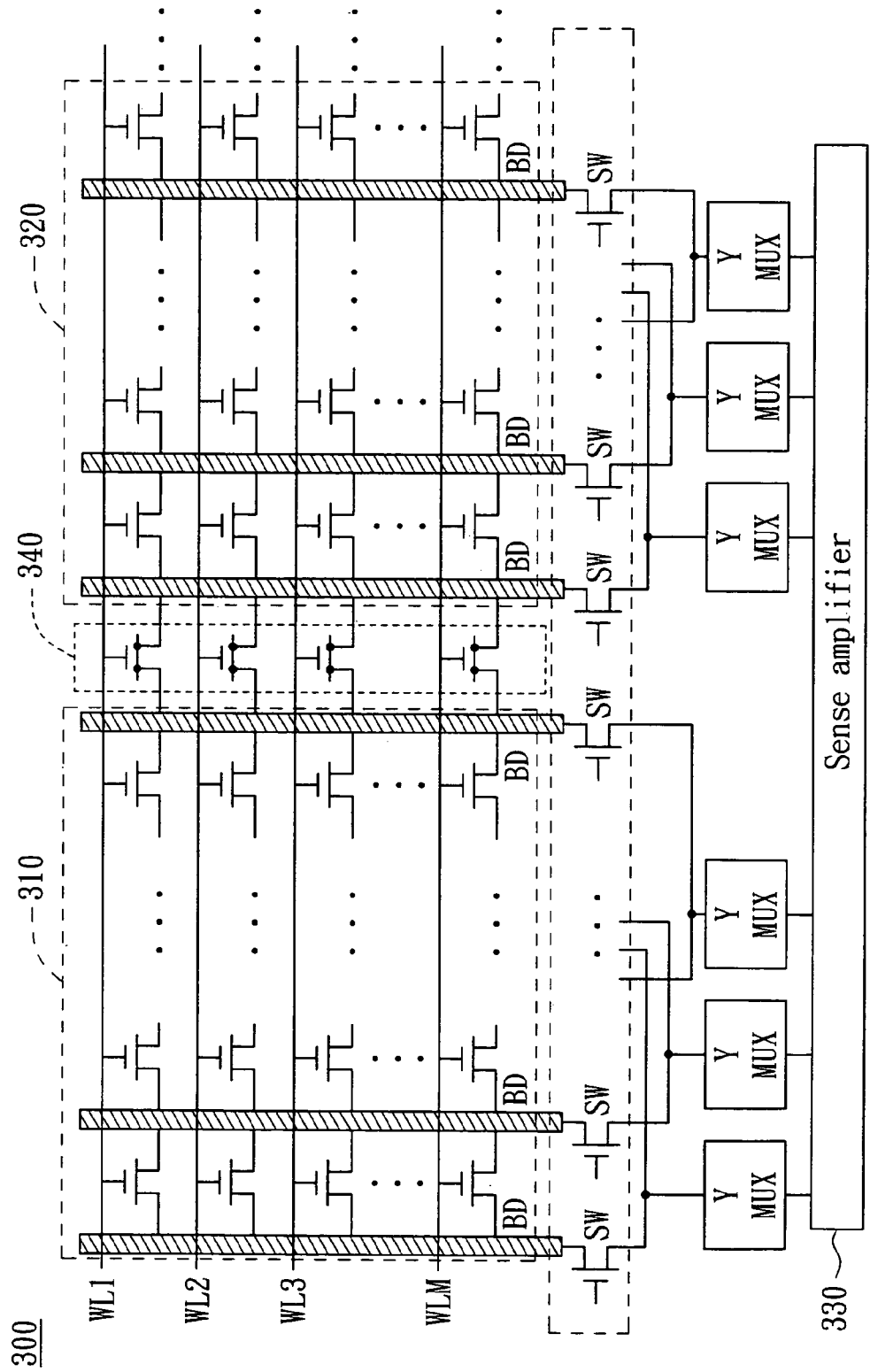
FIG. 3 (Prior Art) is a schematic illustration showing a conventional charge-trapping memory structure using a dummy cell.
Figure 4:
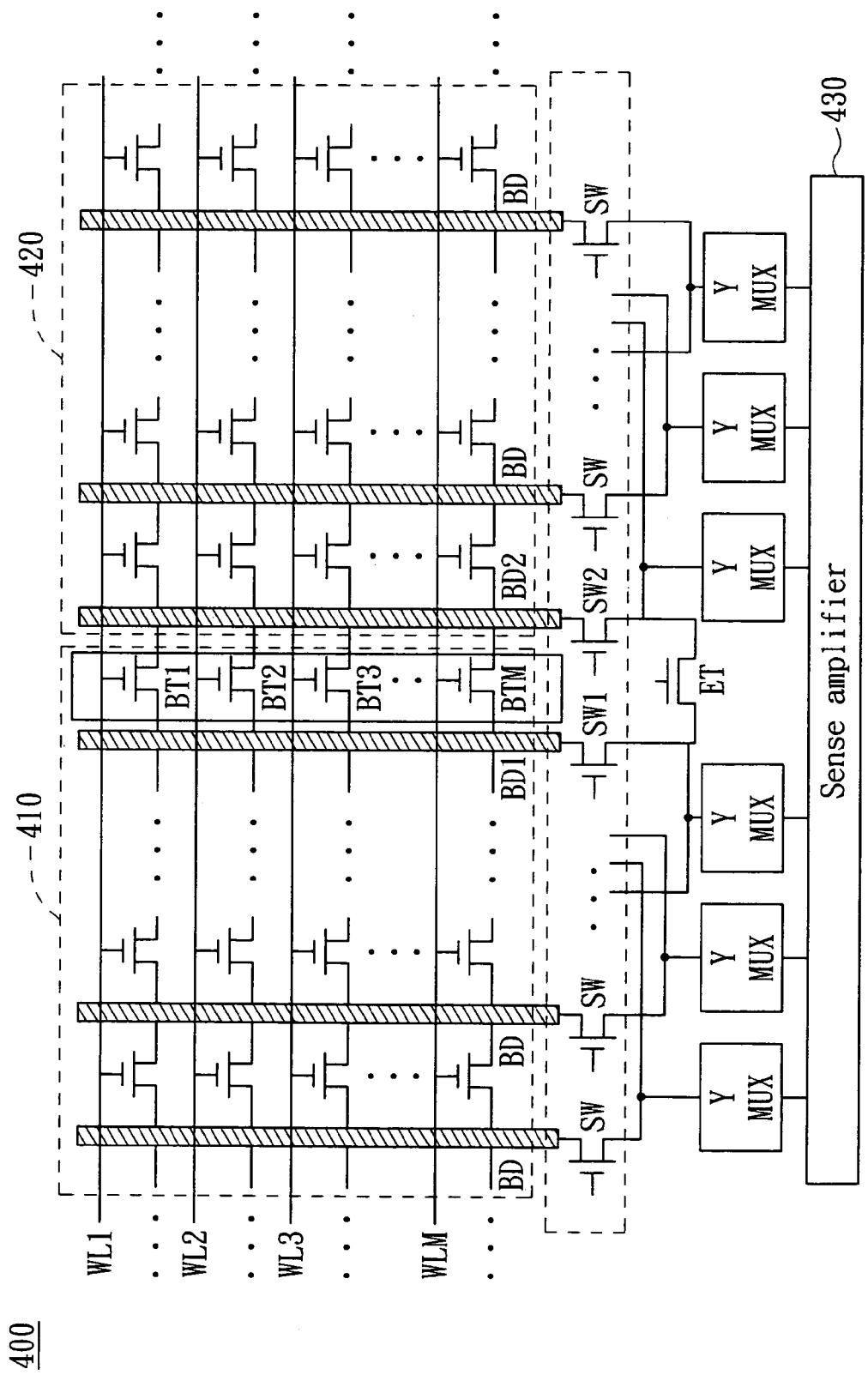
FIG. 4 is a schematic illustration showing a charge-trapping memory structure according to a preferred embodiment of the invention.

FIG. 4 is a schematic illustration showing a charge-trapping memory structure 400 according to a preferred embodiment of the invention. Referring to FIG. 4, the charge-trapping memory structure 400, for example, a N-bit structure, being a virtual ground array includes M word lines WL1 to WLM, multiple charge-trapping memory cell blocks and an equalization transistor ET, wherein M is a positive integer. In FIG. 4, only a first charge-trapping memory cell block 410 and a second charge-trapping memory cell block 420 are illustrated without limitation. Each of the first charge-trapping memory cell block 410 and the second charge-trapping memory cell block 420 includes multiple memory cells. Each memory cell includes a transistor, which is a floating gate field effect transistor. The memory cells, for example, are N-bit cells.

In addition, each of the first charge-trapping memory cell block 410 and the second charge-trapping memory cell block 420 further includes multiple bit lines BD, each of which is formed by buried diffusion and coupled to a switch SW, for example, a band select transistor. In addition, Y multiplexers coupled to a sense amplifier 430 correspond to the first charge-trapping memory cell block 410 and the second charge-trapping memory cell block 420 and correspond to two bit lines BD.

In the first charge-trapping memory cell block 410, M boundary charge-trapping memory cells abutting on the boundary of the second charge-trapping memory cell block 420 have transistors defined as boundary transistors BT1 to BTM, the bit line coupled to the boundary transistors BT1 to BTM in the first charge-trapping memory cell block 410 is defined as a first bit line BD1, and the bit line coupled to the boundary transistors BT1 to BTM in the second charge-trapping memory cell block 420 is defined as a second bit line BD2 which substantially abuts on the first bit line BD1. The control terminals of the boundary transistors BT1 to BTM are respectively coupled to corresponding word lines.

In addition, the charge-trapping memory structure 400 further includes multiple switches SW. The switch corresponding to the first bit line BD1 is defined as a first switch SW1, and the switch corresponding to the second bit line BD2 is defined as a second switch SW2. The first switch SW1 has a first terminal coupled to the first bit line BD1, a second terminal coupled to a first terminal of the equalization transistor ET and a control terminal controlled by a first control signal. The second switch SW2 has a first terminal coupled to the second bit line BD2, a second terminal coupled to a second terminal of the equalization transistor ET and a control terminal controlled by a second control signal. The control terminal of the equalization transistor ET is controlled by an equalization enable signal eq_en. The first control signal turns on the first switch SW1 and the second control signal turns on the second switch SW2 such that the boundary transistors BT1 to BTM can perform the erasing operations.

The invention also discloses a method for preventing the charge-trapping memory cell from being over erased. For example, in the charge-trapping memory structure 400, the first charge-trapping memory cell block 410 is a repaired array block and the second charge-trapping memory cell block 420 is an erased block. First, the first control signal turns on the first switch SW1 and the second control signal turns on the second switch SW2 such that the boundary transistors BT1 to BTM can perform the erasing operations.

Next, after the boundary transistors BT1 to BTM are completely erased, the equalization enable signal eq_en will turn on the equalization transistor ET to electrically connect the first bit line BD1 to the second bit line BD2 to make the voltage level of the first bit line BD1 equal the voltage level of the second bit line BD2 before the read operation (RD, PV, EV) so that the voltage levels of the first terminal and the second terminal of each of the boundary transistors BT1 to BTM are equal to each other. Consequently, although the boundary charge-trapping memory cells corresponding to the boundary transistors BT1 to BTM are over erased, it will not cause any effect to the corresponding ory cell. Because the voltage levels of the first terminal and the second terminal of each of the boundary transistors BT1 to BTM are equal to each other and the leakage currents will not be generated, the sense amplifier 430 can see correct currents through the Y multiplexers and the verification of the charge-trapping memory structure 400 has no error.

Similarly, when the first charge-trapping memory cell block 410 and the second charge-trapping memory cell block 420 are the erased blocks, the method for improving the over erasing effect of the charge-trapping memory cell is also utilized to prevent the boundary charge-trapping memory cells at the boundary between the first charge-trapping memory cell block 410 and the second charge-trapping memory cell block 420 generating leakage currents.

The method for improving the over erasing effect of the charge-trapping memory cell and the charge-trapping memory structure thereof according to the embodiment of the invention utilize an equalization transistor to equalize the voltage levels of two bit lines coupled to the boundary transistors after the charge-trapping memory cell blocks are completely erased such that the voltage levels of the first terminal and the second terminal of the boundary transistor are equal to each other. So, the charge-trapping memory cell corresponding to the boundary transistor cannot generate a leakage current. Meanwhile, compared with the prior art charge-trapping memory structure, only one equalization transistor is added, and the influence on the layout area is extremely small without loss of the layout area. In addition, because the over erasing effect is improved and the boundary transistor has no leakage current, the prior art problem of read error caused by the leakage current is also solved, and the precision of the verification of the charge-trapping memory structure is enhanced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for improving an over erasing effect of a charge-trapping memory cell in a charge-trapping memory structure, the charge-trapping memory cell having a transistor, which has a first terminal coupled to a first bit line and a second terminal coupled to a second bit line, the charge-trapping memory structure comprising a first switch and a second switch, the first switch having a first terminal coupled to the first bit line, the second switch having a first terminal coupled to the second bit line, the method comprising the steps of:

erasing the charge-trapping memory cell by turning on the first switch and the second switch; and when the erased charge-trapping memory cell is to be read for verification, employing an equalization transistor, having a first terminal coupled to a second terminal of the first switch and a second terminal coupled to a second terminal of the second switch, to electrically connect the first bit line to the second bit line and make a voltage level of the first bit line equal a voltage level of the second bit line such that a voltage level of the first terminal of the transistor equals a voltage level of the second terminal of the transistor to correctly verify the erased charge-trapping memory cell.

2. A charge-trapping memory structure, comprising:
   M word lines, wherein M is a positive integer;
   a first charge-trapping memory cell block having M boundary charge-trapping memory cells and one first bit line, wherein the first charge-trapping memory cell block is a repaired array block, each of the boundary charge-trapping memory cells has a boundary transistor, and the boundary transistors have control terminals respectively coupled to the corresponding word lines, and first terminals coupled to the first bit line;
   a second charge-trapping memory cell block having a second bit line abutting on the first bit line, wherein the second charge-trapping memory cell block is an erased block and second terminals of the boundary transistors are coupled to the second bit line;
   a first switch having a first terminal coupled to the first bit line, a second terminal, and a control terminal controlled by a first control signal;
   a second switch having a first terminal coupled to the second bit line, a second terminal, and a control terminal controlled by a second control signal; and
   an equalization transistor having a first terminal coupled to the second terminal of the first switch, a second terminal coupled to the second terminal of the second switch, and a control terminal controlled by an equalization enable signal.

3. The charge-trapping memory structure according to claim 2, wherein the charge-trapping memory structure is a virtual ground array.

4. The charge-trapping memory structure according to claim 2, wherein each of the boundary transistors is a floating gate field effect transistor.

5. The charge-trapping memory structure according to claim 4, wherein each of the first bit line and the second bit line is respectively formed by buried diffusion.

6. The charge-trapping memory structure according to claim 2, wherein the boundary transistors are also completely erased when the second charge-trapping memory cell block is completely erased, and the equalization enable signal turns on the equalization transistor to make the voltage level of the first bit line equal the voltage level of the second bit line.

7. The charge-trapping memory structure according to claim 5, wherein each of the first charge-trapping memory cell block and the second charge-trapping memory cell block is an erased block.

8. The charge-trapping memory structure according to claim 7, wherein the boundary transistors are also completely erased when the second charge-trapping memory cell block is completely erased, and the equalization enable signal turns on the equalization transistor to make the voltage level of the first bit line equal the voltage level of the second bit line.

9. The charge-trapping memory structure according to claim 2, said structure being a N-bit structure, wherein the charge-trapping memory cells are N-bit cells.

10. A method for improving an over erasing effect of a charge-trapping memory cell in a charge-trapping memory structure, the charge-trapping memory cell having a transistor, which has a first terminal coupled to a first bit line and a second terminal coupled to a second bit line, the charge-trapping memory structure including a first switch and a second switch, the first switch having a first terminal coupled to the first bit line, the second switch having a first terminal coupled to the second bit line, the method comprising the steps of:

erasing the charge-trapping memory cell by turning on the first switch and the second switch; and reading the erased charge-trapping memory cell for verification, including electrically connecting the first bit line to the second bit line employing an equalization transistor having a first terminal coupled to a second terminal of the first switch and a second terminal coupled to a second terminal of the second switch, and equalizing a voltage level of the first bit line and a voltage level of the second bit line, such that a voltage level of the first terminal of the transistor equals a voltage level of the second terminal of the transistor, correctly to verify the erased charge-trapping memory cell.

* * * * *